(12) United States Patent
Ohshima

(10) Patent No.: US 7,933,103 B2
(45) Date of Patent: Apr. 26, 2011

(54) OVERCURRENT DETECTION DEVICE

(75) Inventor: Shunzou Ohshima, Kosai (JP)

(73) Assignee: Yazaki Corporation, Toko (JP)

( * ) Notice: Subject to any disclaimer, the term of this patent is extended or adjusted under 35 U.S.C. 154(b) by 41 days.

(21) Appl. No.: 11/524,296

(22) Filed: Sep. 21, 2006

(65) Prior Publication Data

US 2007/0064368 A1 Mar. 22, 2007

(30) Foreign Application Priority Data

Sep. 21, 2005 (JP) ................................ P2005-274369

(51) Int. Cl.
*H02H 3/08* (2006.01)
(52) U.S. Cl. ...................................... 361/93.1
(58) Field of Classification Search ............... 361/93.1
See application file for complete search history.

(56) References Cited

U.S. PATENT DOCUMENTS

| | | | | |
|---|---|---|---|---|
| 5,164,877 A * | 11/1992 | Furuhata et al. | ............... | 361/111 |
| 5,371,420 A * | 12/1994 | Nakao | ............... | 326/27 |
| 6,215,634 B1 * | 4/2001 | Terasawa | ............... | 361/100 |
| 6,330,143 B1 * | 12/2001 | Maly et al. | ............... | 361/101 |
| 6,525,516 B2 * | 2/2003 | Schultz et al. | ............... | 323/282 |
| 6,590,757 B2 * | 7/2003 | Pahl et al. | ............... | 361/93.2 |
| 6,727,794 B2 * | 4/2004 | Busletta et al. | ............... | 336/200 |
| 6,831,821 B2 * | 12/2004 | Ohshima | ............... | 361/86 |
| 2004/0207967 A1 | 10/2004 | Ohshima | | |

FOREIGN PATENT DOCUMENTS

| | | |
|---|---|---|
| JP | 4-61432 U | 5/1992 |
| JP | 2001-326432 A | 11/2001 |
| JP | 2002-353794 | 12/2002 |
| JP | 2003-270275 A | 9/2003 |
| JP | 2004-048498 | 2/2004 |
| WO | WO 92/15052 | 9/1992 |

OTHER PUBLICATIONS

Japanese Patent Office Action dated Dec. 18, 2009 issued in application No. 2005-274369.

* cited by examiner

*Primary Examiner* — Jared J Fureman
*Assistant Examiner* — Scott Bauer
(74) *Attorney, Agent, or Firm* — Sughrue Mion, PLLC

(57) ABSTRACT

Disclosed is an overcurrent detection device for detecting an overcurrent in a load circuit which is arranged to control the driving and the stopping of a load 1 by a semiconductor switch (FET1) provided between a battery VB and the load 1. An added voltage (V1−V3) is generated which is obtained by adding a voltage (V1−V2) generated across the both ends of the semiconductor switch (FET1) to a voltage (V3−V2) which is generated at the time of current change due to the inductance Lp of a copper foil wiring pattern 3 for coupling the semiconductor switch (FET1) and the load 1. A comparator CMP1 for comparing the added voltage with an overcurrent determination voltage (V1−V4) set in advance is provided. When the comparator CMP1 detects that the added voltage exceeds the overcurrent determination voltage, it is determined that an overcurrent is generated.

2 Claims, 2 Drawing Sheets

OVERCURRENT DETECTION DEVICE

BACKGROUND OF THE INVENTION

1. Field of the Invention

The present invention relates to an overcurrent detection device for detecting an overcurrent of a load circuit which performs the on/off control of a load by using a semiconductor switch.

2. Description of the Related Art

For example, a load such as a lamp or a motor mounted on a vehicle is coupled to a battery (DC power source) via a semiconductor switch, whereby the load is controlled so as to be driven and stopped by turning on and off the semiconductor switch, respectively.

In such a load circuit, an excessive current flows through a coupling electric wire when a short circuit occurs. Thus, upon the detection of the generation of an overcurrent, it is necessary to immediately turn the semiconductor switch of f thereby to protect the circuit entirely.

Thus, there has been proposed a circuit which is arranged in a manner that a voltage generated between the two terminals of the semiconductor switch is measured, and the generation of an overcurrent is detected when the measured voltage exceeds an overcurrent determination voltage set in advance thereby to turn the semiconductor switch off.

FIG. 2 is a circuit diagram of a related art showing the configuration of a load circuit including an overcurrent detection device. As shown in this figure, a semiconductor switch (FET101) is provided between a load 101 and a battery VB. The drain of the semiconductor switch (FET101) is coupled to the positive electrode side terminal of the battery VB and the source (voltage V2) thereof is coupled to the one end of the load 101. Each of the other end of the load 101 and the negative electrode side terminal of the battery VB is grounded.

The load 101 includes a resistance component RL and an inductance component LL.

The gate of the semiconductor switch (FET101) is coupled to the output terminal of a driver circuit 102 via a resistor R103. Numerical values described at the lower sides of the symbols R101 to R103 of the resistors represent concrete resistance values of these resistors, respectively.

The positive electrode side terminal of the battery VB (the drain of the FET101) is grounded via a series circuit of the resistors R101 and R102. Thus, supposing that the voltage of the battery VB (the drain voltage of the FET101) is V1, the voltage at the coupling point (hereinafter, this voltage is referred to a reference voltage V4) between the resistors R101 and R102 equals to a voltage obtained by dividing the voltage V1 by the resistors R101 and R102. The reference voltage V4 is supplied to the negative side input terminal of a comparator CMP101, whilst the source voltage V2 of the semiconductor switch (FET101) is supplied to the positive side input terminal of the comparator CMP101.

Supposing that the voltage between the drain and the source of the semiconductor switch (FET101) is V DS, the drain current thereof is ID and the on-resistance of the semiconductor switch (FET101) is Ron, the following expression (1) is obtained.

$$V DS = V1 - V2 = Ron \cdot ID \qquad (1)$$

Supposing that the difference (V1−V4) between the battery voltage V1 and the reference voltage V4 is the overcurrent determination voltage, when the voltage V DS between the drain and the source exceeds the overcurrent determination voltage (V1−V4), the output signal of the comparator CMP101 is inverted, whereby the overcurrent is detected. When the generation of the overcurrent is detected, a turn-off instruction signal is supplied to the driver circuit 102, whereby a drive signal having been supplied to the gate of the semiconductor switch (FET101) is stopped thereby to turn the semiconductor switch (FET101) off.

In other words, supposing that the on resistance Ron of the semiconductor switch (FET101) is constant, when the current flowing into the load 101, that is, the drain current ID increases, the voltage V DS between the drain and the source increases. When the voltage V DS between the drain and the source exceeds the overcurrent determination voltage (V1−V4), the semiconductor switch (FET101) is tuned off thereby to protect the circuit.

In order to prevent that the drain current (the current flowing through the load 101) which is a current normal state, is erroneously determined as an overcurrent, the overcurrent determination voltage (V1−V4) is set to a value lager than the maximum value (hereinafter referred to as V DSmax) of the voltage V DS between the drain and the source in the normal state. That is, in order to prevent that a large current generated in the normal state such as a rush current generated at the time of turning-on of a power supply is erroneously determined as an overcurrent, the overcurrent determination voltage (V1−V4) is required to be set to be larger than the maximum V DSmax of the voltage V DS between the drain and the source generated in the normal state.

Further, in view of the facts that the comparator (CMP101) has an offset voltage±Voff peculiar to elements and that there is a voltage variation A due to the variance of the respective parts constituting a control circuit, the overcurrent determination voltage (V1−V4) is required to be set so as to satisfy the following expression (2).

$$(V1 - V4) > V DSmax + Voff + A \qquad (2)$$

Thus, the overcurrent determination voltage (V1−V4) is inevitably set to a value lager than the voltage V DS between the drain and the source generated in the normal state.

However, when the overcurrent determination voltage (V1−V4) is set to a value lager than the voltage V DS between the drain and the source generated in the normal state, in the case where a short-circuit occurs and so an overcurrent flows actually, it takes a long time to turn the semiconductor switch (FET101) off thereby to protect the circuit.

As described above, in the overcurrent detection device of the related art, in order to prevent that a large current such as a rush current generated in the normal state is erroneously determined as an overcurrent, the overcurrent determination voltage (V1−V4) is required to be set to a large value. On the other hand, in the case where an overcurrent is generated due to a short-circuit etc., in order to detect this phenomenon immediately to turn the semiconductor switch (FET101) off thereby to protect the parts and electric wires, there is a demand that the overcurrent determination voltage (V1−V4) is required to be as close as possible to the voltage V DS between the drain and the source generated in the normal state. These requirements are antinomy and so there is a problem that it is not easy to satisfy these requirements simultaneously.

SUMMARY OF THE INVENTION

The invention has been made in order to solve such the problem of the related art and an object of the invention is to provide an overcurrent detection device which can make a difference small between a drain current ID in the normal state and a current for detecting the overcurrent determination and which can prevent that a large current generated in the normal state is erroneously determined as an overcurrent.

In order to attain the aforesaid object, the invention claimed in claim 1 of this application is an overcurrent detection device for detecting an overcurrent in a load circuit which is arranged to control driving and stopping of a load by a semiconductor switch provided between a DC power source and the load, wherein a comparison voltage is generated which is obtained by adding a first voltage generated across both ends of the semiconductor switch to a second voltage which is generated at a time of current change due to an inductance component of an electric wire for coupling the semiconductor switch and the load, a comparison means for comparing the added voltage with an overcurrent determination voltage set in advance is provided, and when the comparison means detects that the added voltage exceeds the overcurrent determination voltage, it is determined that an overcurrent is generated.

The invention claimed in claim 2 is arranged in a manner that the semiconductor switch is disposed on a board, at least a part of the electric wire for coupling the semiconductor switch and the load is formed by a copper foil provided in the board, and a voltage generated at a time of current change due to the inductance component of the copper foil is the second voltage.

According to the invention claimed in claim 1, the second voltage which is generated at the time of current change due to the inductance component of the electric wire for coupling the semiconductor switch is obtained. The second voltage is added to the first voltage which is the voltage across both ends of the semiconductor switch. The added voltage is compared with the overcurrent determination voltage thereby to detect the generation of an overcurrent. Thus, in the case where the current value changes abruptly in a short time like a dead shorted current, the second voltage becomes large and exceeds the overcurrent determination voltage quickly. Thus, the generation of the overcurrent can be detected at a time point before the current value becomes too large. When the overcurrent is detected, the semiconductor switch is turned off and so the circuit can be protected surely.

The second voltage does not become so large according to the current change rate due to a rush current flowing in the normal state and so the added voltage does not exceed the overcurrent determination voltage. Thus, a so-called an erroneous determination can be prevented in which it is determined to be an overcurrent despite of the normal operation.

According to the invention claimed in claim 2, the copper foil is provided between the semiconductor switch and the load and the second voltage is generated by using the inductance component of the copper foil. Thus, since a desired inductance component can be provided by the quite simple configuration, the circuit configuration can be simplified.

DESCRIPTION OF THE PREFERRED EMBODIMENTS

Figure 1:
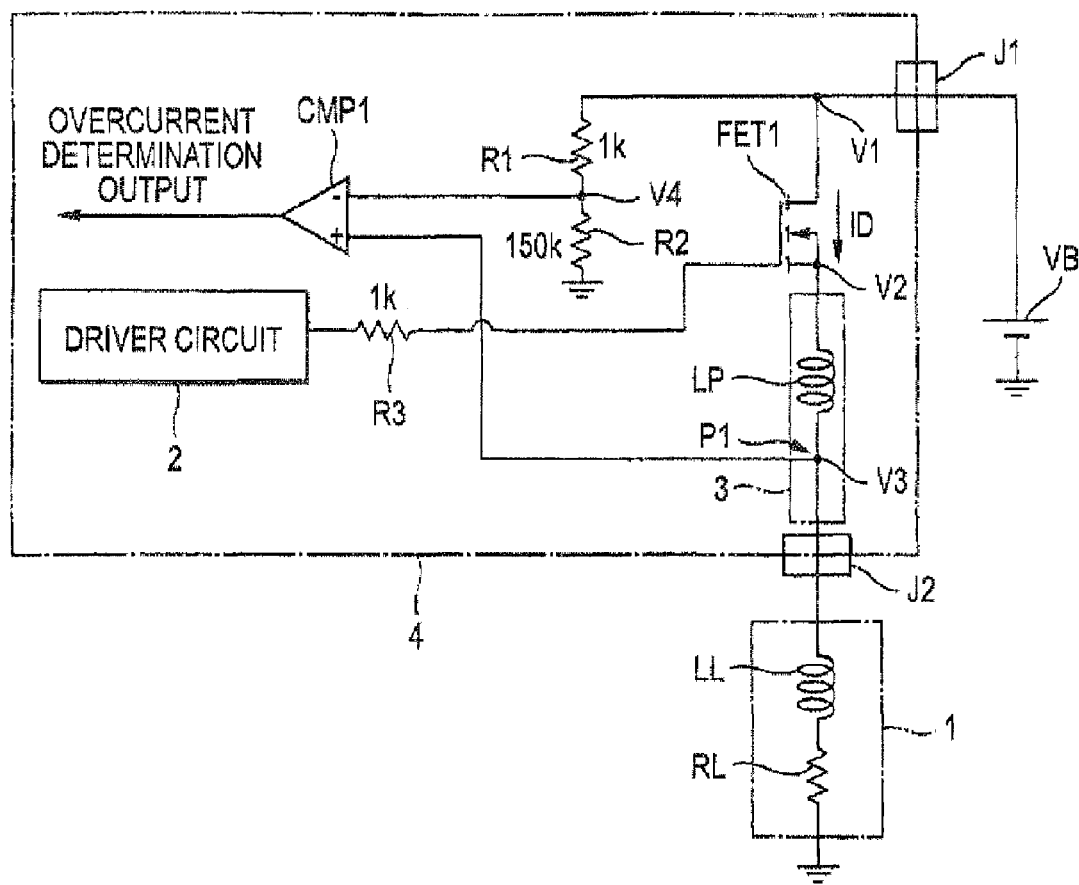
FIG. 1 is a circuit diagram showing the configuration of a load driving circuit including an overcurrent detection device according to an embodiment of the invention.

Hereinafter, an embodiment of the invention will be explained based on the drawings. FIG. 1 is a circuit diagram showing the configuration of a load circuit including an overcurrent detection device according to the embodiment of the invention. The load circuit shown in this figure includes a battery (a DC power source) VB, a load 1 such as a motor or a lamps and a print board 4 provided between the battery VB and the load 1.

The positive electrode side output terminal of the battery VB is coupled to the connector J1 of the print board 4 and the negative electrode side output terminal thereof is grounded.

The load 1 includes an inductance component LL and a resistance component RL. One end of the load is coupled to the connector J2 of the print board 4 and the other end thereof is grounded.

The print board 4 includes a semiconductor switch (FET 1) for turning the load 1 on and off, a comparator CMP 1 (comparison means), a driver circuit 2, a copper foil wiring pattern 3 and resistors R1 to R3.

The semiconductor switch (FET 1) and the copper foil wiring pattern 3 are coupled between the connectors J1 and J2. The drain of the semiconductor switch (FET 1) is coupled to the connector J1 and the source thereof is coupled to the connector J2 via the copper foil wiring pattern 3. It is supposed that the drain voltage (the voltage of the connector J1) of the semiconductor switch (FET 1) is V1, the source voltage thereof is V2, and further the voltage at a desired point P1 on the connector J2 side of the copper foil wiring pattern 3 is V3. The point P1 is coupled to the positive side input terminal of the comparator CMP1. The copper foil wiring pattern 3 is formed in an elongated rectangular shape and includes an inductance Lp.

The gate of the semiconductor switch (FET 1) is coupled to the driver circuit 2 via the resistor R3.

The connector J1 is grounded via a series circuit of the resistors R1 and R2, and the coupling point (the voltage thereof is referred to a reference voltage V4) between the resistors R1 and R2 is coupled to the negative side input terminal of the comparator CMP1.

That is, the comparator CMP1 compares magnitudes between an overcurrent determination voltage (V1−V4) and an added voltage (V1−V3) which is obtained by adding a voltage V DS (V1−V2: a first voltage) between the drain and the source of the semiconductor switch (FET 1) to a voltage (V2−V3: a second voltage) generated across the both ends of the inductance Lp due to the current change, and inverts an output signal thereof when the added voltage (V1−V3) exceeds the overcurrent determination voltage (V1−V4) thereby to detect the generation of an overcurrent.

Next, the explanation will be made as to the operation of the load circuit in which the overcurrent detection device according to the embodiment configured in this manner is used.

When a drive signal is output from the driver circuit 2 at the time of driving the load 1, the drive signal is supplied to the gate of the semiconductor switch (FET1) via the resistor R3 thereby to turn the semiconductors witch (FET1) on. Thus, a current flows through a path of the battery VB, the semiconductor switch (FET1), the copper foil wiring pattern 3 and the load 1 thereby to drive the load 1.

When the difference (V1−V3) between the drain voltage V1 of the semiconductor switch (FET1) and the voltage V3 at the point P1 exceeds the overcurrent determination voltage (V1−V4) which is obtained as a difference between the voltage V1 and the reference voltage V4, that is, when the following expression (3) is satisfied, the output signal of the comparator CMP1 is inverted thereby to stop the output signal from the driver circuit 2. As a result, the semiconductor switch (FET1) is turned off thereby to protect parts and electric wires constituting the load circuit.

$$(V1-V3)>(V1-V4) \quad (3)$$

Supposing that the inductance of the copper foil wiring pattern 3, that is, an inductance between the source of the semiconductor switch (FET1) and the point P1 is Lp, the on-resistance of the semiconductor switch (FET1) is Ron, a drain current is ID, and the drain current satisfying the expression (3) is ID2, the following expression (4) is obtained.

$$(V1-V4)=Ron \cdot ID2+Lp \cdot dID2/dt \quad (4)$$

The first item of the right side in the expression (4) represents the voltage (V1−V2) between the drain and the source of the semiconductor switch (FET1), and the second item of the right side in the expression (4) represents the voltage (V2−V3) which is generated in correspondence with the time change of the current due to the inductance Lp.

Figure 2:
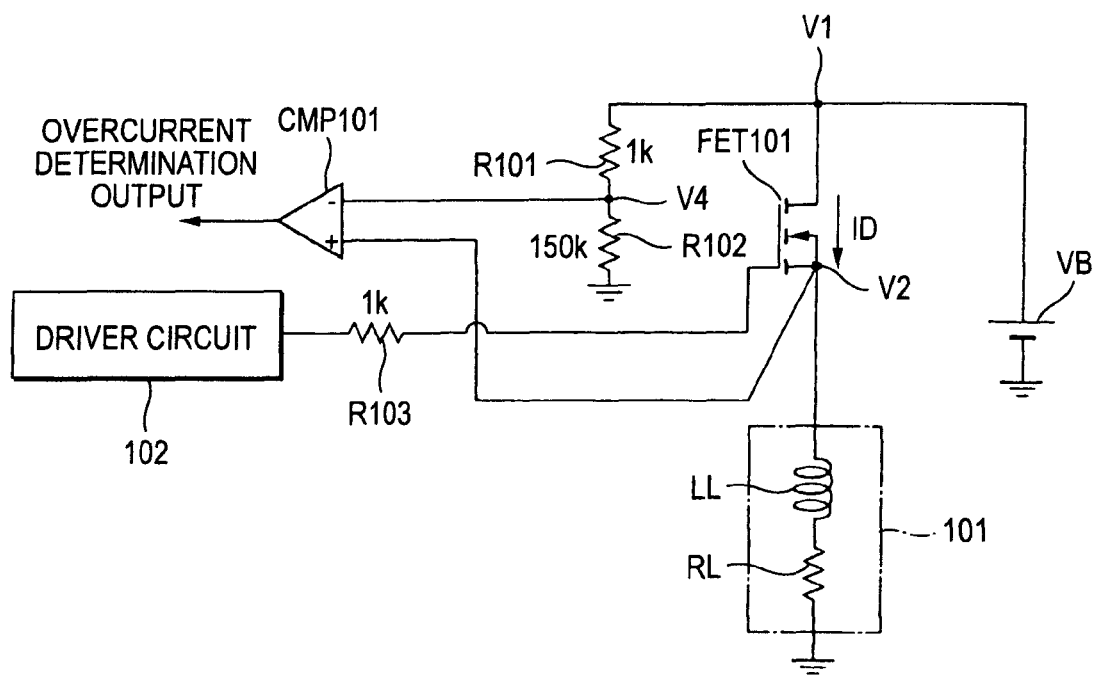
FIG. 2 is a circuit diagram showing the configuration of a load driving circuit including an overcurrent detection device of a related technique.

Supposing that the drain current at the time of being determined as an abnormal current in the method shown in FIG. 2 represented as the related art is ID1, the following expression (5) is obtained.

$$(V1-V4)=Ron \cdot ID \quad (5)$$

The relation of the drain currents ID1, ID2 with respect to the same voltage (V1−V4) based on the expressions (4) and (5) is represented in the following expression (6).

$$Ron \cdot ID2+Lp \cdot dID2/dt=Ron \cdot ID1$$

$$ID2-ID1-(Lp/Ron) \cdot (dID2/dt) \quad (6)$$

According to the expression (6), under the same overcurrent condition, the current ID2 is smaller than the current ID1 by (Lp/Ron)·(IdID2/dt). That is, when an overcurrent is generated, the overcurrent can be detected thereby to turn the semiconductor switch (FET1) off at the current smaller by (Lp/Ron)·(dID2/dt) as compared with the related art.

Next, the explanation will be made as to the concrete relation between the shape of the copper foil wiring pattern 3 and the inductance. When the shape of the copper foil wiring pattern 3 is set to have a width of 3 mm, a thickness of 0.4 mm and a length 0.5 of 20 mm, the inductance Lp of the copper foil wiring pattern 3 is about 0.016 [μH]. The resistance value of the copper foil wiring pattern 3 at this time is a quite small value of 0.34 [mΩ] and so this resistance value is neglected.

Supposing that the on-resistance Ron of the semiconductor switch (FET1) is 5 [mΩ] and the temporal change rate dID2/dt of the current ID2 is $1 \cdot 10^6$ [A/s], the following expression (7) is obtained.

$$(Lp/Ron) \cdot (dID2/dt)=\{(0.016 \cdot 10^6)(0.005)\} \cdot (1 \cdot 10^6)= 3.2\ [A] \quad (7)$$

That is, in this embodiment, it is understood that the overcurrent determination value is smaller by 3.2 [A] as compared with the overcurrent detection method shown in the related art.

Since the value of dID2/dt is the temporal change rate of the current increase, when the current increasing rate becomes larger, the determination current value become smaller, and so the effects of the embodiment is enhanced. In contrast, when the current increasing rate becomes smaller, the determination current value become larger, and so the effects of the embodiment is degraded.

In this manner, in the overcurrent detection device according to the embodiment, the copper foil wiring pattern 3 is provided between the semiconductor switch (FET1) and the load 1, and when the drain current ID changes abruptly, the voltage in proportion to the temporal changing amount of this current is generated by using the inductance Lp of the copper foil wiring pattern 3. Then, the voltage (V1−V3) which consists of an additional value of the voltage thus generated in the inductance Lp and the voltage between the source and the drain of the semiconductor switch (FET1) is generated, and the voltage (V1−V3) is compared with the overcurrent determination voltage (V1−V4) thereby to detect the generation of the overcurrent.

Thus, in the case where the current increases abruptly like the occurrence of a short circuit, the voltage generated by the inductance Lp becomes large, and so voltage (V1−V3) can be made large. In other words, the generation of the overcurrent can be detected at a time point where the current flowing upon the generation of the overcurrent is small, whereby the parts and the electric wires etc. constituting the circuit can be prevented from being damaged.

Further, since the current change rate due to a rush current flowing at the time of turning-on of the power source is smaller as compared with the current change rate at the time of generation of the overcurrent, the voltage component generated due to the inductance Lp, that is, the voltage of the second item of the right side in the expression (4) is small, so that the rush current is prevented from being erroneously determined as the overcurrent.

As described above, although overcurrent detection device according to the invention is explained based on the embodiment shown in the figure, the invention is not limited thereto and the configurations of the respective parts may be replaced by arbitrary configurations having the similar functions.

For example, in this embodiment, the copper foil wiring pattern 3 is provided between the semiconductor switch (FET1) and the load 1, the voltage according to the temporal changing amount of this current is generated by using the inductance Lp of the copper foil wiring pattern. However, the invention is not limited thereto and the similar effects can be obtained by using the inductance component of the electric wire coupling the semiconductor switch (FET1) and the load 1.

The invention is quite useful for detecting the generation of an overcurrent quickly.

What is claimed is:

1. An overcurrent detection device for detecting an overcurrent in a load circuit which is arranged to control driving and stopping of a load by a semiconductor switch which consists of a MOSFET comprising a first end and a second end, the semiconductor switch provided between a DC power source and the load, the overcurrent detection device comprising:
    a comparator, comparing an added voltage with an overcurrent determination voltage which is set in advance, the added voltage being obtained by adding a first voltage generated across the first end and the second end of the semiconductor switch by a drain current flowing through an on-state resistance in the semiconductor switch to a second voltage generated at a time of current change of the drain current due to an inductance component of an electric wire which couples the semiconductor switch and the load;
    wherein the comparator detects that an overcurrent is generated when the added voltage exceeds the overcurrent determination voltage.

2. The overcurrent detection device according to claim 1, wherein
    the semiconductor switch is disposed on a board, at least a part of the electric wire for coupling the semiconductor switch and the load comprises a copper foil provided in the board and a voltage generated at a time of current change due to the inductance component of the copper foil is the second voltage.

* * * * *